(12) United States Patent
Liu et al.

(10) Patent No.: US 11,282,871 B2
(45) Date of Patent: Mar. 22, 2022

(54) ARRAY SUBSTRATE AND MANUFACTURING METHOD THEREOF, AND DISPLAY DEVICE

(71) Applicants: BOE TECHNOLOGY GROUP CO., LTD., Beijing (CN); CHENGDU BOE OPTOELECTRONICS TECHNOLOGY CO., LTD., Sichuan (CN)

(72) Inventors: Tingliang Liu, Beijing (CN); Hongwei Ma, Beijing (CN); Kai Zhang, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu (CN)

( * ) Notice: Subject to any disclaimer, the term of this patent is extended or adjusted under 35 U.S.C. 154(b) by 852 days.

(21) Appl. No.: 16/072,407

(22) PCT Filed: Dec. 15, 2017

(86) PCT No.: PCT/CN2017/116447
§ 371 (c)(1),
(2) Date: Jul. 24, 2018

(87) PCT Pub. No.: WO2018/223654
PCT Pub. Date: Dec. 13, 2018

(65) Prior Publication Data
US 2021/0210526 A1    Jul. 8, 2021

(30) Foreign Application Priority Data

Jun. 9, 2017 (CN) .......................... 201710431986.1

(51) Int. Cl.
*H01L 27/12* (2006.01)
*H01L 27/32* (2006.01)

(52) U.S. Cl.
CPC ........ *H01L 27/1259* (2013.01); *H01L 27/124* (2013.01); *H01L 27/1248* (2013.01); *H01L 27/3258* (2013.01); *H01L 27/3276* (2013.01)

(58) Field of Classification Search
CPC ... H01L 27/12; H01L 27/124; H01L 27/1244; H01L 27/1248; H01L 27/1259; H01L 27/32; H01L 27/3258; H01L 27/3276
(Continued)

(56) References Cited

U.S. PATENT DOCUMENTS 9,064,749 B2   6/2015   Chen et al.
9,793,366 B2  10/2017   Liu et al.
(Continued)

FOREIGN PATENT DOCUMENTS

CN          1504818 A     6/2004
CN        101090128 A    12/2007
(Continued)

OTHER PUBLICATIONS

The Second Chinese Office Action dated Jan. 7, 2021; Appln. No. 201710431986.1.
(Continued)

*Primary Examiner* — Fazli Erdem

(57) ABSTRACT

An array substrate and a manufacturing method thereof, and a display device are provided. The manufacturing method of the array substrate includes forming a source-drain metal pattern on a substrate, wherein the substrate includes a display region and a peripheral region located around the display region, the source-drain metal pattern located on the peripheral region including a plurality of metal wires; and forming a protective structure on a lateral side of each of the
(Continued)

metal wires, wherein the protective structure contacts and covers the lateral side of each of the metal wires.

14 Claims, 6 Drawing Sheets

(58) Field of Classification Search
USPC .......................................................... 257/40
See application file for complete search history.

(56) References Cited

U.S. PATENT DOCUMENTS

| | | |
|---|---|---|
| 2006/0175286 A1 | 8/2006 | Matsushita et al. |
| 2008/0032431 A1 | 2/2008 | Hsu et al. |
| 2013/0015471 A1* | 1/2013 | Park .......................... C23F 1/02 257/88 |
| 2013/0334534 A1 | 12/2013 | Fujii et al. |
| 2014/0175467 A1 | 6/2014 | Choi |
| 2015/0069401 A1 | 3/2015 | Na et al. |
| 2015/0200208 A1 | 7/2015 | Lee et al. |
| 2017/0294499 A1* | 10/2017 | Lu ..................... H01L 21/76877 |
| 2018/0144950 A1* | 5/2018 | Jeong .................. H01L 21/0272 |

FOREIGN PATENT DOCUMENTS

| | | |
|---|---|---|
| CN | 101577274 A | 11/2009 |
| CN | 103165540 A | 6/2013 |
| CN | 104900656 A | 9/2015 |
| JP | H0862628 A | 3/1996 |

OTHER PUBLICATIONS

The First Indian Office Action dated Dec. 1, 2020; Appln. No. 201847027697.

Extended European Search Report dated Feb. 4, 2021; Appln. No. 17892060.9.

International Search Report and Written Opinion dated Feb. 24, 2018; PCT/CN2017/116447.

* cited by examiner

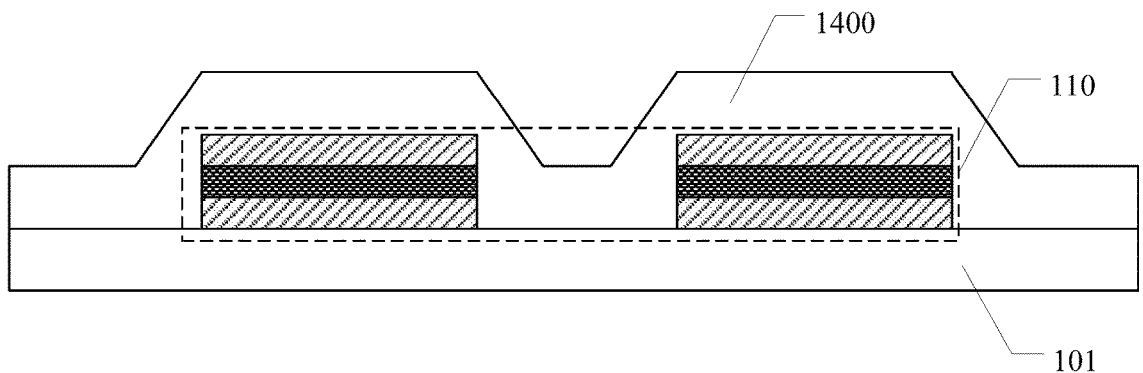

FIG. 1d

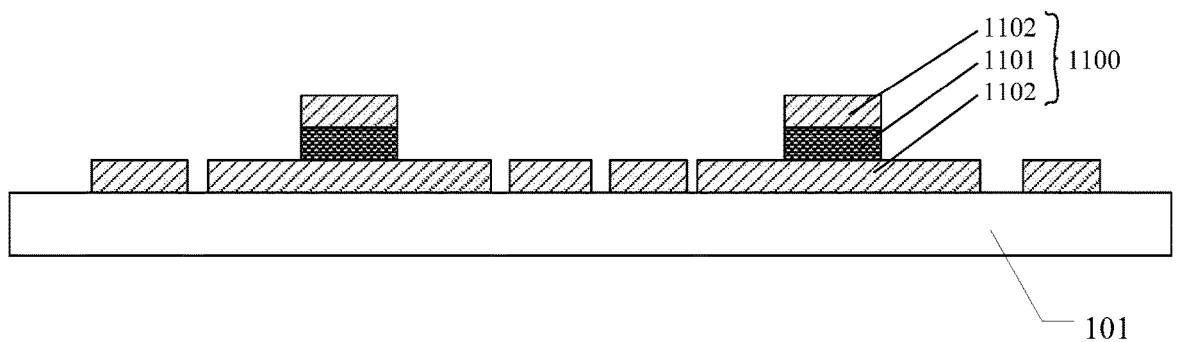

FIG. 1e

| forming a source-drain metal pattern on a substrate, the substrate including a display region and a peripheral region located around the display region, the source-drain metal pattern located on the peripheral region including a plurality of metal wires | S101 |

↓

| forming a protective structure on a lateral side of each of the metal wires, the protective structure contacting and covering the lateral side of each of the metal wires | S102 |

FIG. 2

ARRAY SUBSTRATE AND MANUFACTURING METHOD THEREOF, AND DISPLAY DEVICE

CROSS REFERENCE

The present application claims priority of Chinese Patent application No. 201710431986.1 filed on Jun. 9, 2017, the content of which is incorporated in its entirety as portion of the present application by reference herein.

TECHNICAL FIELD

Embodiments of the present disclosure relate to a manufacturing method of an array substrate, an array substrate and a display device.

BACKGROUND

With the continuous development of display technology, liquid crystal display (LCD) and organic light emitting diode (OLED) have become mainstream in the market. Liquid crystal display generally includes an array substrate provided with a plurality of thin film transistors, an opposing substrate and a liquid crystal layer disposed between the array substrate and the opposing substrate. Organic light emitting diode generally includes an array substrate provided with a plurality of thin film transistors, an opposing substrate, and an organic light emitting layer disposed between the array substrate and the opposing substrate.

Because high-resolution display devices have a better visual effect, people's requirements for the resolution of display devices are also increasing. And, with the development of wearable display devices, the display devices are required to arrange more pixels on a smaller area.

SUMMARY

At least one embodiment of the present disclosure provides a manufacturing method of an array substrate, which includes: forming a source-drain metal pattern on a substrate, wherein the substrate comprises a display region and a peripheral region located around the display region, the source-drain metal pattern located on the peripheral region comprises a plurality of metal wires; and forming a protective structure on a lateral side of each of the metal wires, wherein the protective structure contacts and covers the lateral side of each of the metal wires.

In some examples, forming the source-drain metal pattern on the substrate includes: forming a source-drain metal layer on the substrate; forming a first photoresist on a side of the source-drain metal layer away from the substrate; forming a first photoresist pattern by exposing and developing the first photoresist using a first mask plate; and forming the source-drain metal pattern by taking the first photoresist pattern as a mask to etch the source-drain metal layer.

In some examples, forming the protective structure on the lateral side of each of the metal wires includes: forming a protective layer covering the source-drain metal pattern on a side of the source-drain metal pattern away from the substrate; and patterning the protective layer by using a second mask plate to remove the protective layer on a side of the metal wires away from the substrate and leave the protective layer on the lateral side of the metal wires to form the protective structure.

In some examples, the protective layer includes a second photoresist.

In some examples, the first photoresist is a positive photoresist, and the second photoresist is a negative photoresist.

In some examples, the first photoresist is a negative photoresist, the second photoresist is a positive photoresist, and the second mask plate and the first mask plate are the same mask plate.

In some examples, the manufacturing method of the array substrate further includes: forming a first electrode layer on a side of the source-drain metal pattern and the protective structure away from the substrate; and patterning the first electrode layer to form a first electrode layer pattern and expose the metal wires and the protective structure.

In some examples, patterning the first electrode layer to form the first electrode layer pattern and expose the metal wires and the protective structure includes a wet etching process.

In some examples, the source-drain metal pattern comprises a first metal layer and second metal layers located on both sides of the first metal layer.

At least one embodiment of the present disclosure provides an array, which includes: a substrate; and a source-drain metal pattern, disposed on the substrate; wherein the substrate comprises a display region and a peripheral region around the display region, the source-drain metal pattern located on the peripheral region comprises a plurality of metal wires, a lateral side of each of the metal wires is provided with a protective structure, and the protective structure contacts and covers the lateral side of each of the metal wires.

In some examples, a material of the protective structure includes photoresist.

In some examples, the source-drain metal pattern includes a first metal layer and second metal layers located on both sides of the first metal layer.

In some examples, the first metal layer includes at least one selected from the group consisting of copper, aluminum, and silver.

In some examples, the second metal layers include titanium.

In some examples, the array substrate further includes: an anode, located on a side of the source-drain metal pattern away from the substrate; an organic light emitting layer, located on a side of the anode away from the substrate; and a cathode, located on a side of the organic light emitting layer away from the substrate.

At least one embodiment of the present disclosure provides a display device, including the array substrate in any one of the abovementioned examples.

The manufacturing method of the array substrate can prevent the etching solution from etching the metal wires during a subsequent etching process, so as to prevent the occurrence of short circuit or open circuit on the array substrate, and then improve the yield rate of the product.

BRIEF DESCRIPTION OF THE DRAWINGS

In order to clearly illustrate the technical solution of embodiments of the present disclosure, the drawings of the embodiments will be briefly described in the following, it is obvious that the drawings in the description are only related to some embodiments of the present disclosure and not limited to the present disclosure.

FIGS. 1a to 1e are schematic diagrams of steps of a manufacturing method of an array substrate;

FIG. 2 is a flow chart of a manufacturing method of an array substrate provided by an embodiment of the present disclosure;

DETAILED DESCRIPTION

In order to make objects, technical details and advantages of the embodiments of the present disclosure apparently, the technical solutions of the embodiments will be described in a clearly and fully understandable way in connection with the drawings related to the embodiments of the present disclosure. It is obvious that the described embodiments are just a part but not all of the embodiments of the present disclosure. Based on the described embodiments herein, a person having ordinary skill in the art may obtain other embodiment(s), without any inventive work, which should be within the scope of the disclosure.

Unless otherwise defined, the technical terms or scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. The terms "comprises," "comprising," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly.

As the display device develops in a direction of high resolution, narrow frames, and high PPI (Pixel Per Inch), the line widths and line spaces of various circuits on an array substrate in a liquid crystal display device or an organic light emitting display device are continuously narrowed, thereby easily causing short circuit and open circuit of the circuits by impurity particles, metal remaining, and etching loss, and then reducing the yield rate of the product. For example, in a manufacturing process of an array substrate of an active matrix organic light emitting diode (AMOLED), an anode is usually wet etched, and the acidic etching solution thereof has severe over-etching of an exposed metal layer below, thereby resulting in defects such as short circuit and open circuit.

Figure 1A:
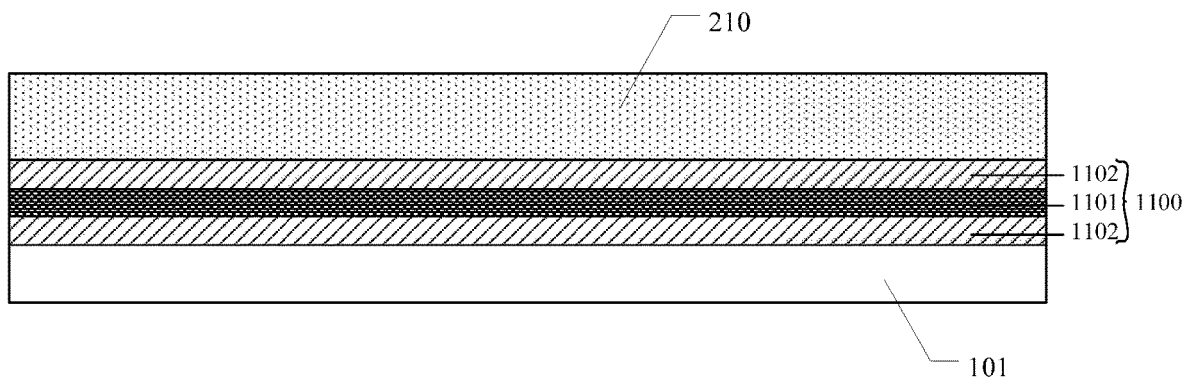
Figure 1B:
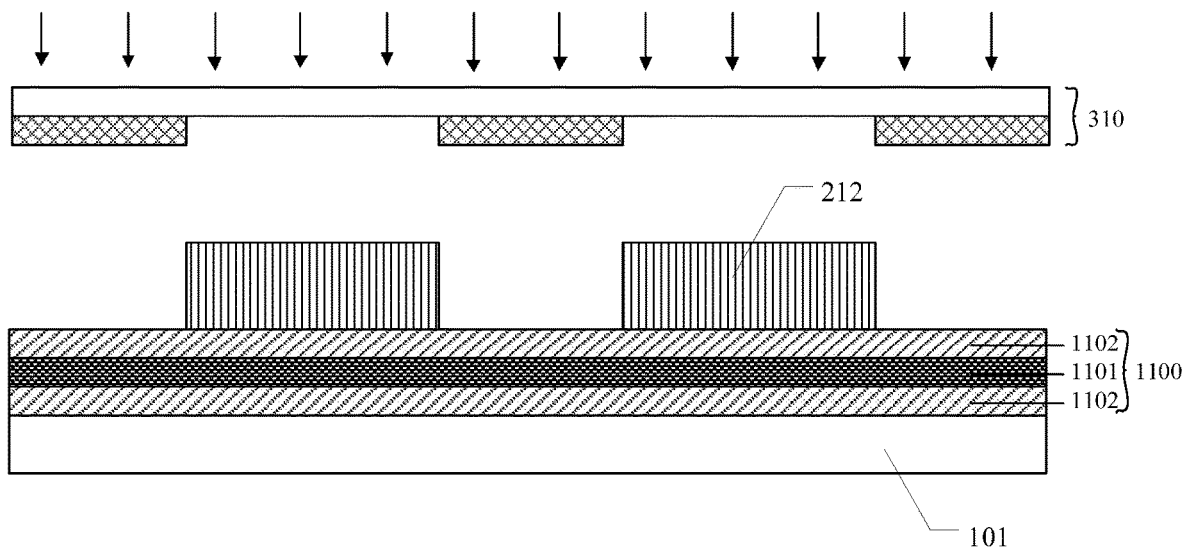
Figure 1C:
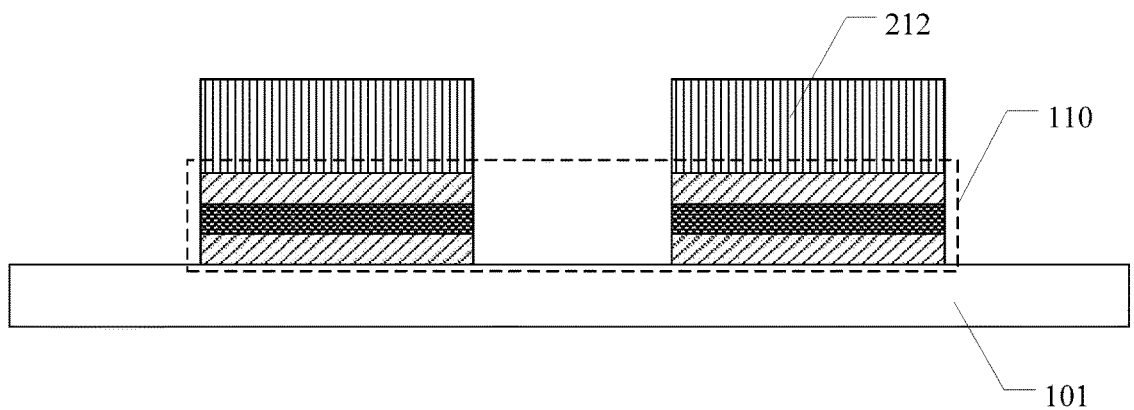

FIGS. 1a to 1e are schematic diagrams of steps of a manufacturing method of an array substrate. As illustrated in FIG. 1a, a source-drain metal layer 1100 is formed on a substrate 101, the source-drain metal layer 1100 can include a first metal layer 1101 and second metal layers 1102 stacked on both sides of the first metal layer 1101, photoresist 210 is formed on a side of the source-drain metal layer 1100 away from the substrate 101; as illustrated in FIG. 1b, the photoresist 210 is exposed and developed by using a first mask plate 210 to form photoresist pattern 212; as illustrated in FIG. 1c, the source-drain metal layer 1100 is etched by using the photoresist pattern 212 as a mask to form a source-drain metal pattern 110, FIG. 1c illustrates the source-drain metal pattern in a peripheral region of the substrate; as illustrated in FIG. 1d, an anode layer 1400 for forming an anode is formed on the source-drain metal pattern 110; as illustrated in FIG. 1e, the anode layer is etched and removed. As illustrated in FIG. 1e, the etching solution over-etches the first metal layer 1101 in the source-drain metal pattern 110, thereby causing the second metal layers 1102 on the etched first metal layer 1101 to float, and then be broken and fall off. The fallen second metal layers usually has a shape of long strip, and is extremely likely to remain in the array substrate, thereby causing short circuit in the circuit of the array substrate, and then causing defects such as light and dark spots.

Therefore, embodiments of the present disclosure provide an array substrate and a manufacturing method thereof, and a display device. The manufacturing method of the array substrate includes forming a source-drain metal pattern on a substrate, wherein the substrate includes a display region and a peripheral region located around the display region, the source-drain metal pattern located on the peripheral region includes a plurality of metal wires; and forming a protective structure on a lateral side of each of the metal wires, wherein the protective structure contacts and covers the lateral side of each of the metal wires. Thus, upon the array substrate produced by the abovementioned manufacturing method of the array substrate being performed a subsequent etching process, the etching solution is blocked by the protective structure, thereby preventing the metal wires from being etched, preventing the occurrence of short circuit or open circuit on the array substrate, and then improving the yield rate of the product.

Hereinafter, the array substrate and the manufacturing method thereof, and the display device provided in the embodiments of the present disclosure will be described below with reference to the accompanying drawings.

An embodiment of the present disclosure provides a manufacturing method of an array substrate. FIG. 2 is a manufacturing method of an array substrate according to an embodiment of the present disclosure. As illustrated in FIG. 2, the manufacturing method of the array substrate includes steps S101-S102.

S101: forming a source-drain metal pattern on a substrate, the substrate including a display region and a peripheral region located around the display region, the source-drain metal pattern located on the peripheral region including a plurality of metal wires. It should be noted that, the plurality of metal wires located on the peripheral region can be utilized to be bonded with an external drive circuit. The source-drain metal pattern located in the display region can include a source electrode and a drain electrode of a thin film transistor and a data line and so on.

Figure 3:
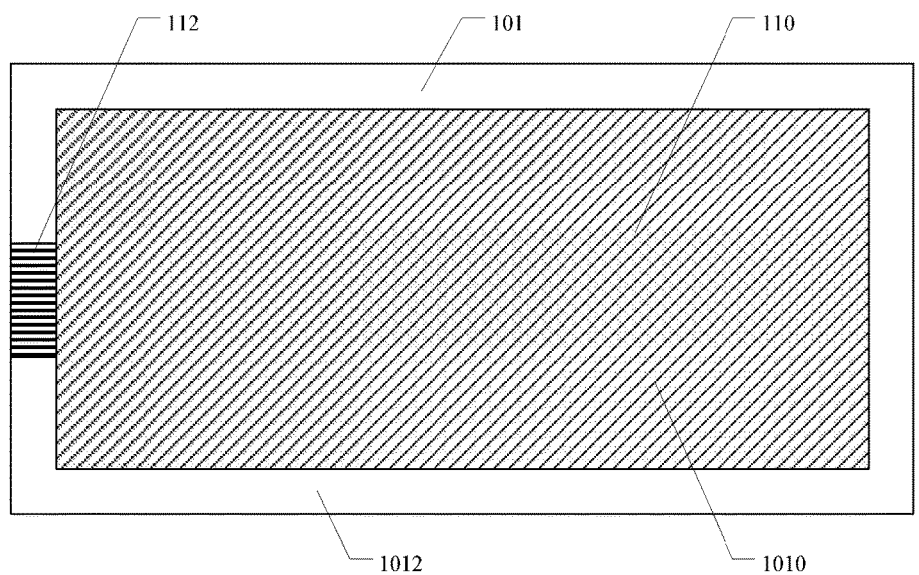
FIG. 3 is a planar view of an array substrate provided by an embodiment of the present disclosure.

For example, FIG. 3 is a planar view of an array substrate according to the present disclosure. As illustrated in FIG. 3, the source-drain metal pattern 110 is formed on the substrate 101, the substrate 101 includes the display region 1010 and the peripheral region 1012 located around the display region 1010, the source-drain metal pattern 110 located on the peripheral region 1012 includes the plurality of metal wires 112.

S102: forming a protective structure on a lateral side of each of the metal wires, the protective structure contacting and covering the lateral side of each of the metal wires.

In the manufacturing process of the array substrate, in order to electrically connect leads of an external driving circuit and the plurality of metal wires in the array substrate, no insulating layer is provided above the plurality of the metal wires (for example, a gate insulating layer or a passivation layer or the like). Therefore, during a subsequent process of forming and patterning other metal layers (such as an anode), the etching solution may corrode the metal wires in the peripheral region, thereby causing defects such as short circuit and open circuit. However, in the manufacturing method of the array substrate provided by the present embodiment, because the protective structure formed on the lateral side of the metal wires that contacts and covers the metal wires can prevent the etching solution from corroding the metal wires, thereby avoiding the defects such as short circuit and open circuit, and then improving the yield rate of the product. For example, upon the metal wires being a titanium/aluminum/titanium stack structure, the manufacturing method of the array substrate provided by the present embodiment can prevent the etching solution from etching aluminum from the lateral side, and can prevent titanium on the etched aluminum from being broken and falling off due to etching of aluminum, thereby preventing the occurrence of short circuit. It should be noted that, both sides of a normal metal wire in a direction perpendicular to the substrate is provided with a layer having a strong corrosion resistance, for example, the metal wire can be a titanium/aluminum/titanium laminate, and titanium has a strong corrosion resistance; therefore, the etching solution mainly corrodes the metal wire from a lateral side of the metal wire.

It should be noted that, the manufacturing method of the array substrate provided by embodiments of the present disclosure can not only form the protective structure on the lateral side of the source-drain metal pattern in the peripheral region, but also form a protective structure on a lateral side of a source-drain metal pattern in the display region, which is not limited thereto.

For example, in the manufacturing method of the array substrate provided by an example of the present embodiment, the step of forming the source-drain metal pattern on the substrate includes: forming a source-drain metal layer on the substrate; forming a first photoresist on a side of the source-drain metal layer away from the substrate; forming a first photoresist pattern by exposing and developing the first photoresist using a first mask plate; and forming the source-drain metal pattern by taking the first photoresist pattern as a mask to etch the source-drain metal layer.

For example, in the manufacturing method of the array substrate provided by an example of the present embodiment, a step of forming the protective structure on the lateral side of each of the metal wires includes forming a protective layer covering the source-drain metal pattern on a side of the source-drain metal pattern away from the substrate; and patterning the protective layer by using a second mask plate to remove the protective layer on a side of the metal wires away from the substrate and leave the protective layer on the lateral side of the metal wires to form the protective structure. Thus, the protective structure that contacts and covers the lateral side of the metal wires can be formed by patterning the protective layer.

For example, FIGS. 4a to 4e are schematic diagrams of steps of manufacturing an array substrate according to the present embodiment. It should be noted that, the source-drain metal layer or the source-drain metal pattern in FIGS. 4a to 4e adopts a stacked structure. The stacked structure includes the first metal layer and the second metal layers laminated on both sides of the first metal layer in a direction perpendicular to the substrate. Certainly, embodiments of the present disclosure include but are not limited thereto, and the source-drain metal layer or the source-drain metal pattern can adopt other structures.

Figure 4A:
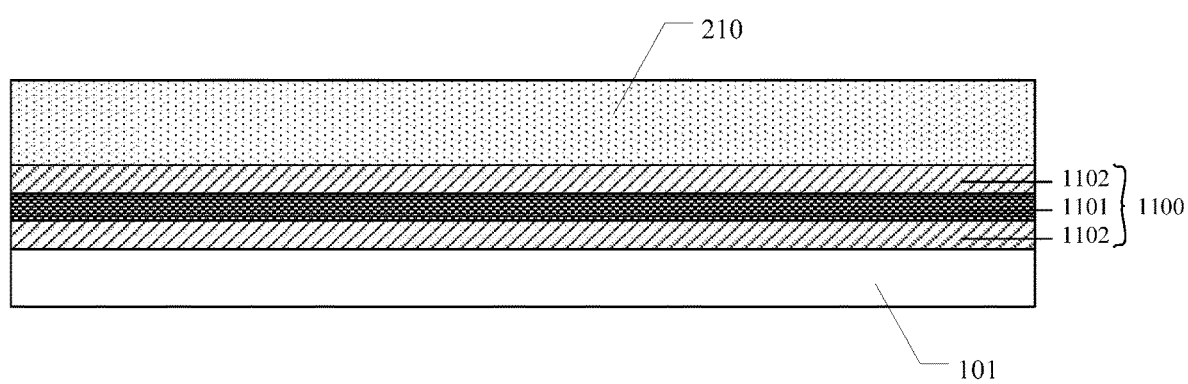
FIGS. 4a to 4e are schematic diagrams of steps of a manufacturing method of an array substrate provided by an embodiment of the present disclosure.

As illustrated in FIG. 4a, the source-drain metal layer 1100 is formed on the substrate 101, and the first photoresist 210 is formed on a side of the source-drain metal layer 1100 away from the substrate 101. The source-drain metal layer 1100 includes the first metal layer 1101 and second metal layers 1102 stacked on both sides of the first metal layer 1101 in the direction perpendicular to the substrate 101. A material of the first metal layer 1101 can include metals such as aluminum, copper, and silver, and a material of the second metal layers 1102 can include titanium. It should be noted that, the specific structure of the source-drain metal layer includes but is not limited thereto.

Figure 4B:
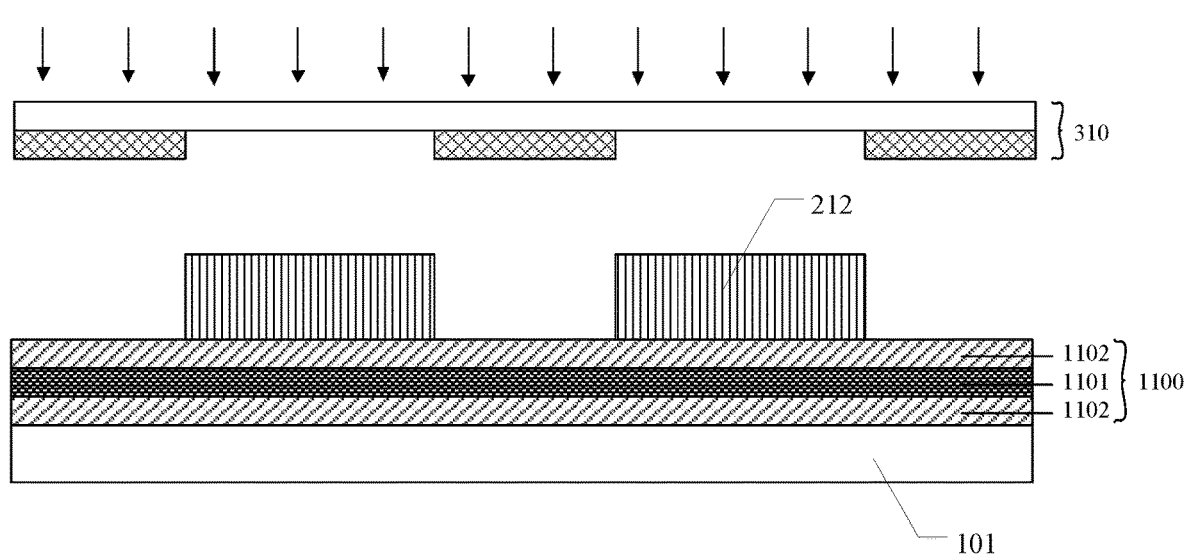

As illustrated in FIG. 4b, the first photoresist 210 is exposed and developed using the first mask plate 310 to form a first photoresist pattern 212; a material of the first photoresist pattern 212 in FIG. 4b is a negative photoresist, that is, an exposed portion is left to form the first photoresist pattern 212. Certainly, embodiments of the present disclosure include but are not limited thereto. The material of the first photoresist pattern can also be a positive photoresist.

Figure 4C:
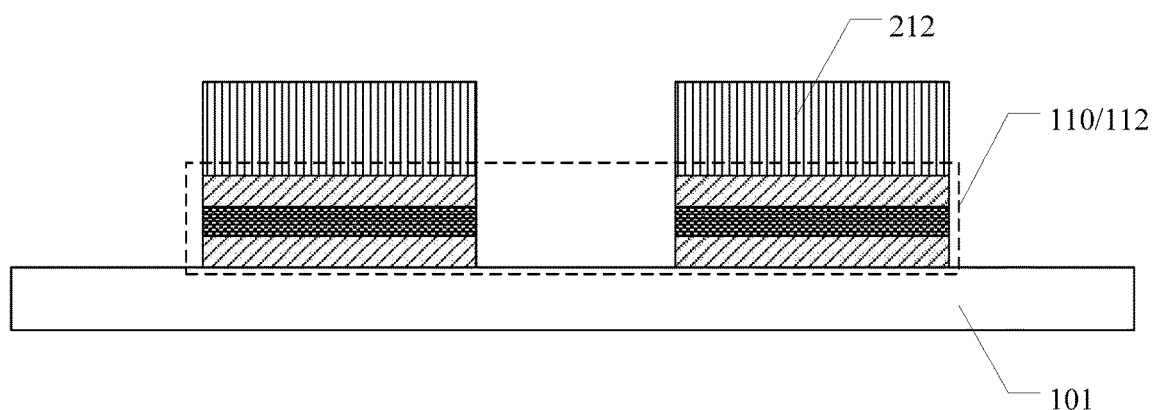

As illustrated in FIG. 4c, the source-drain metal layer 1100 is etched by using the first photoresist pattern 212 as a mask to form the source-drain metal pattern 110. FIG. 4c illustrates the source-drain metal pattern 110 in the peripheral region, that is, the metal wires 112 in the peripheral region.

Figure 4D:
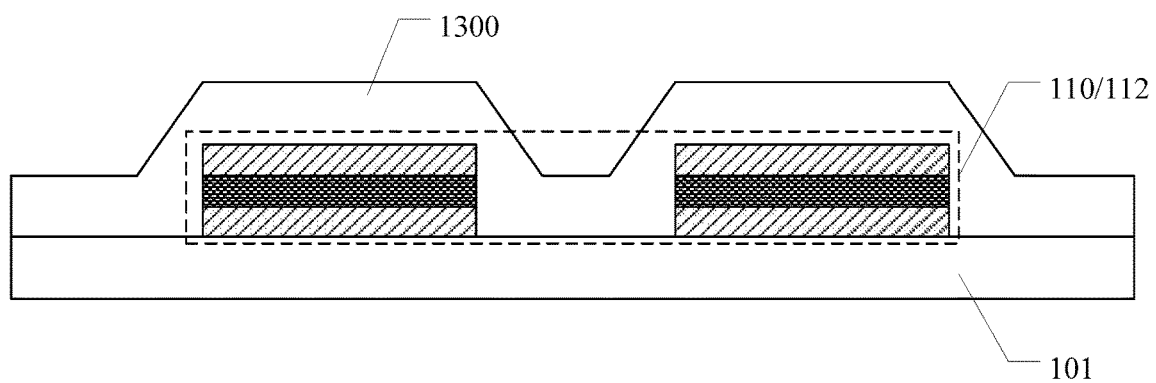

As illustrated in FIG. 4d, the first photoresist pattern 212 is removed; the protective layer 1300 covering the source-drain metal pattern 110 is formed on a side of the source-drain metal pattern 110 away from the substrate 101.

For example, the protective layer 1300 can be a second photoresist, that is, a material of the protective layer 1300 can be photoresist. Thus, the patterning of the protective layer 1300 can be performed directly using an exposure and development process without using an etching process, thereby reducing process steps and cost. Certainly, embodiments of the present disclosure include but are not limited thereto, and the protective layer can also not use photoresist.

Figure 4E:
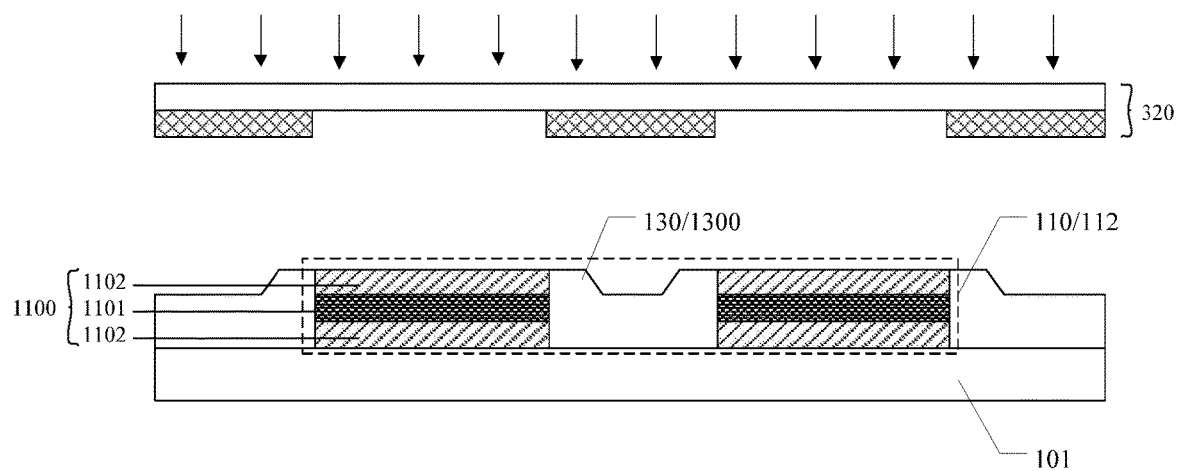

As illustrated in FIG. 4e, the protective layer 1300 is patterned by using a second mask plate 320 to remove the protective layer 1300 on the side of the metal wires 112 away from the substrate 101 and leave the protective layer 1300 on the lateral side of the metal wires 1300 to form the protective structure 130.

For example, the protective layer 1300 in FIG. 4e includes the second photoresist, a material of the second photoresist is a positive photoresist, that is, an exposed portion of the second photoresist is removed. In this case, the second mask plate and the first mask plate can be the same mask plate, so as to reduce the number of mask plates, and then reduce the cost. Certainly, embodiments of the present disclosure include but are not limited thereto, and the property of the second photoresist can be opposite to that of the first photoresist. That is, upon the first photoresist being a positive photoresist, the second photoresist is a negative photoresist; or, upon the first photoresist being a negative photoresist, the second photoresist is a positive photoresist. In this case, the second mask plate and the first mask plate are the same mask plate, so as to reduce the number of mask plates, and then reduce the cost. It should be noted that, upon the second mask plate and the first mask plate being the same mask plate, the protective layer in the display region of the substrate is not completely removed, and the protective layer in the display region is formed around the source-drain metal pattern (the height of the source-drain metal pattern is higher), thereby facilitating the polarization of the display region.

For example, the manufacturing method of the array substrate provided by an example of the present embodiment further includes forming a first electrode layer on a side of the source-drain metal pattern and the protective structure away from the substrate, and patterning the first electrode layer to form a first electrode layer pattern and expose the metal wires and the protective structure. Thus, in a process of forming the first electrode layer and patterning the first electrode layer to form the first electrode layer pattern, the protective structure can play a role of protecting the metal wires, and can prevent the etching solution from corroding the metal wires, so as to avoid the defects such as short circuit and open circuit, thereby improving the yield rate of the product.

Figure 5A:
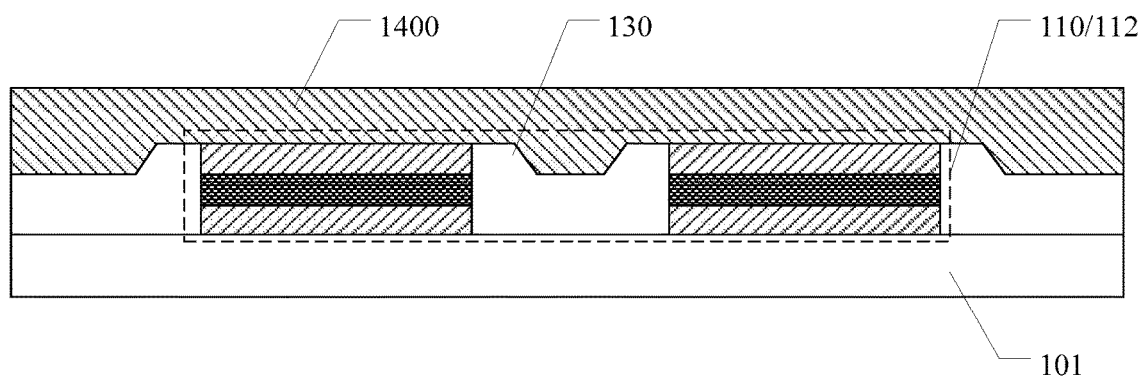
FIGS. 5a to 5b are schematic diagrams of steps of a manufacturing method of another array substrate provided by an embodiment of the present disclosure.
Figure 5B:
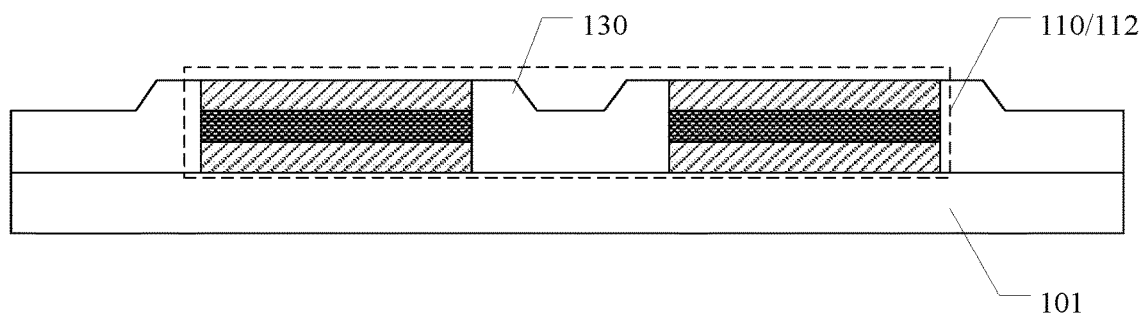

FIGS. 5a to 5b are schematic diagrams of steps of a manufacturing method of another array substrate according to the present embodiment. As illustrated in FIG. 5a, a first electrode layer 1400 is formed on a side of the source-drain metal pattern 110 and the protective structure 130 away from the substrate 101. As illustrated in FIG. 5b, the first electrode layer 1400 is patterned to form a first electrode layer pattern and expose the metal wires 112 and the protective structure 130. It should be noted that, because FIG. 5b illustrates a sectional view of the peripheral region (such as PAD region) of the array substrate, in order to electrically connect leads of an external driving circuit and the plurality of metal wires in the array substrate, the first electrode layer above the metal wires needs to be completely removed.

For example, in the manufacturing method of the array substrate provided by an example of the present disclosure, a process of patterning the first electrode layer to form the first electrode layer pattern and expose the metal wires and the protective structure includes a wet etching process. Because the wet etching process is easy to etch the metal wires, in this case, the protective structure located on the lateral side of the metal wires can prevent the etching solution from corroding the metal wires, so as to avoid the defects such as short circuit and open circuit, thereby improving the yield rate of the product.

Figure 6:
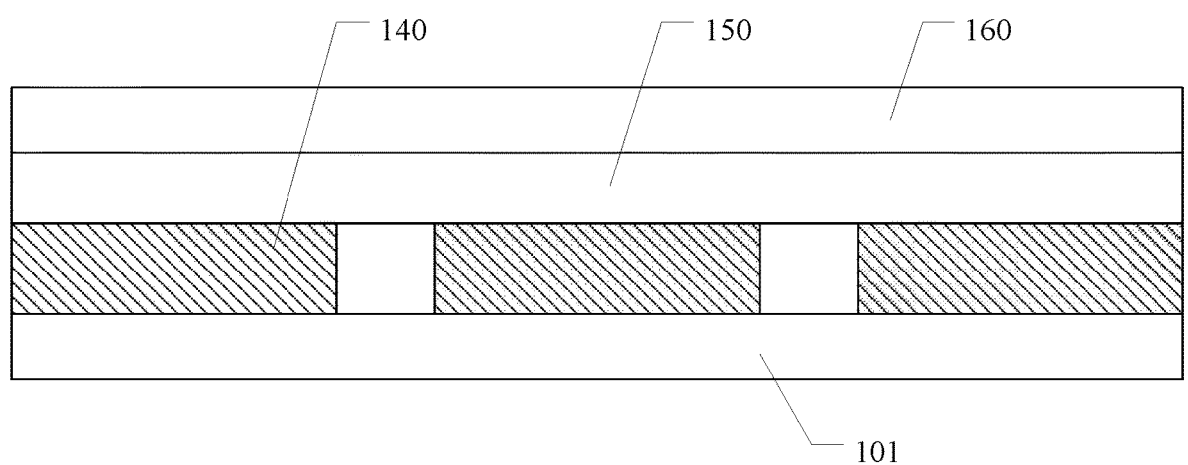
FIG. 6 is a schematic diagram of steps of a manufacturing method of another array substrate provided by an embodiment of the present disclosure.

For example, the manufacturing method of the array substrate provided by an example of the present embodiment further includes forming an organic light emitting layer on a side of the first electrode layer pattern away from the substrate; and forming a second electrode layer on a side of the organic light emitting layer away from the substrate. The first electrode layer pattern includes an anode, and the second electrode layer pattern includes a cathode. FIG. 6 is a schematic diagram of steps of a manufacturing method of an array substrate according to the present embodiment. FIG. 6 illustrates a sectional view of a display region of an array substrate. As illustrated in FIG. 6, the organic light emitting layer 150 is formed on a side of the first electrode layer pattern 140 away from the substrate 101; and the second electrode layer 160 is formed on the organic light emitting layer 150 away from the substrate 101. The first electrode layer pattern 140 includes an anode, and the second electrode layer 160 includes a cathode. Thus, the array substrate can be applied to an organic light emitting diode (OLED) display device. Certainly, embodiments of the present disclosure include but are not limited thereto, the array substrate can also be an array substrate of a liquid crystal display device, and other components and structures thereof can refer to a usual design, which will not be repeated here.

Figure 7A:
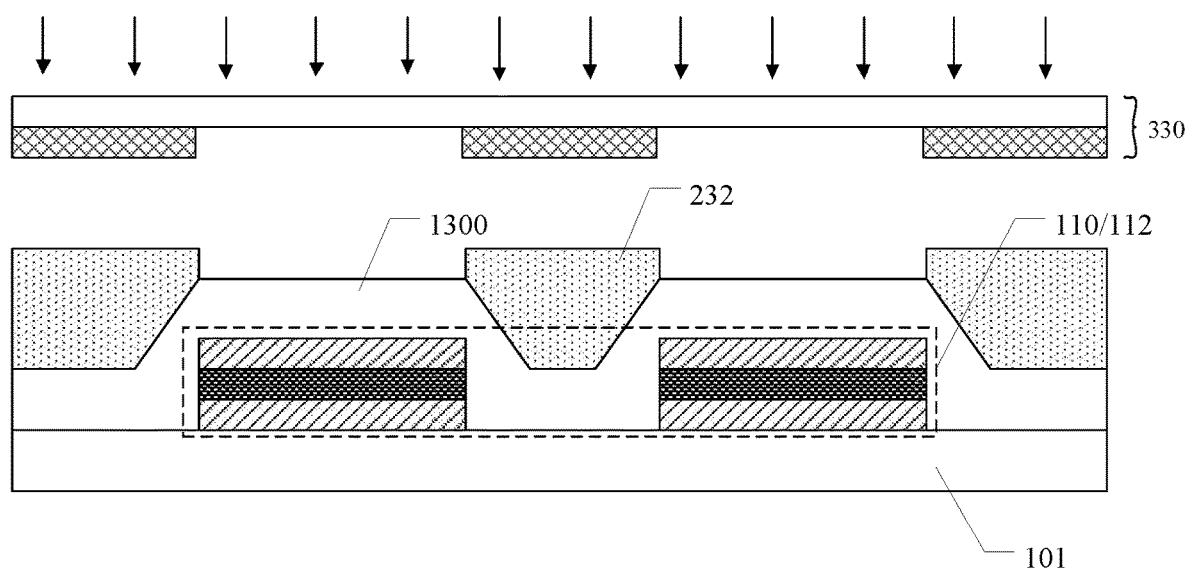
FIGS. 7a to 7b are schematic diagrams of steps of a manufacturing method of another array substrate provided by an embodiment of the present disclosure.
Figure 7B:
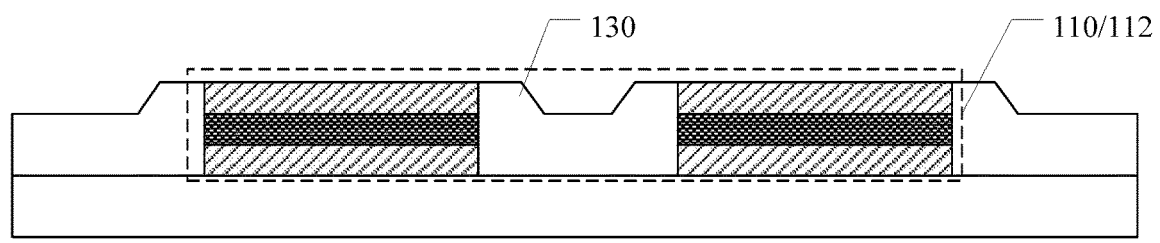

An embodiment of the present disclosure provides a manufacturing method of an array substrate. In the present embodiment, the protective layer is not made of photoresist. FIGS. 7a to 7b are schematic diagrams of steps of a manufacturing method of an array substrate according to the present embodiment. As illustrated in FIG. 7a, after forming the protective layer 1300 covering the source-drain metal pattern 110 on a side of the source-drain metal pattern 110 away from the substrate 101, a third mask plate 330 is used to form a second photoresist pattern 232 on a side of the protective layer 1300 away from the substrate 101. As illustrated in FIG. 7b, the protective layer 1300 is etched by using the second photoresist pattern 232 as a mask to form a protective structure 130, and then the second photoresist pattern 232 is removed.

For example, a material of the protective layer can be selected from one or more of silicon oxide, silicon nitride, and silicon oxynitride.

For example, the third mask plate and the first mask plate can be the same mask plate, so as to reduce the number of mask plates and the cost.

An embodiment of the present disclosure provides an array substrate. FIG. 3 is a planar view of an array substrate according to the present embodiment. FIG. 4e is a sectional view of an array substrate according to the present embodiment. FIG. 4e illustrates a cross section of a peripheral region of the array substrate. As illustrated in FIG. 3, the cross section includes a substrate 101 and a source-drain metal pattern 110 located on the substrate 101. The substrate 101 includes a display region 1010 and a peripheral region 1012 around the display region 1010, and the source-drain metal pattern 110 in the peripheral region 1012 includes a plurality of metal wires 112. As illustrated in FIG. 4e, a lateral side of each of the metal wires is provided with a protective structure 130, and the protective structure 130 contacts and covers the lateral side of each of the metal wires 112.

In order to electrically connect leads of an external driving circuit and the plurality of metal wires in the array substrate, no insulating layer is provided above the plurality of the metal wires (for example, a gate insulating layer or a passivation layer or the like). Therefore, during a subsequent process of forming and patterning other metal layers (such as an anode), the etching solution may corrode metal wires in the peripheral region, thereby causing defects such as short circuit and open circuit. However, in the array substrate provided by the present embodiment, because the protective structure formed on the lateral side of the metal wires that contacts and covers the metal wires can prevent the etching solution from corroding the metal wires, thereby avoiding defects such as short circuit and open circuit, and then improving the yield rate of the product. It should be noted that, both sides of a normal metal wire in a direction perpendicular to the substrate is provided with a layer having a strong corrosion resistance, for example, the metal wire can be a titanium/aluminum/titanium laminate, and titanium has a strong corrosion resistance; therefore, the etching solution mainly corrodes the metal wire from a lateral side of the metal wire.

For example, in the array substrate provided by an example of the present embodiment, a material of the protective structure includes photoresist Thus, the protective structure can be formed only by exposure and development processes, thereby reducing process steps and the cost.

For example, in the array substrate provided by an example of the present embodiment, the source-drain metal pattern can include one or more of a source electrode, a drain electrode and a data line.

For example, in the array substrate provided by an example of the present embodiment, as illustrated in FIG. 4e, the source-drain metal pattern 110 includes a first metal layer 1101 and second metal layers 1102 stacked on both sides of the first metal layer 1101 in a direction perpendicular to the substrate 101. For example, a material of the first metal layer includes one or more of copper, aluminum and silver; a material of the second metal layers includes titanium.

For example, FIG. 6 is a sectional view of an array substrate according to the present embodiment. FIG. 6 illustrates a sectional view of a display region of the array substrate. The array substrate further includes an anode 140, an organic light emitting layer 150 and a cathode 160. The anode 140 is located on a side of the source-drain metal pattern 110 away from the substrate 101; the organic light emitting layer 150 is located on a side of the anode 140 away from the substrate 101; the cathode 160 is located on a side of the organic light emitting layer 150 away from the substrate 101. Thus, the array substrate can be applied to an organic light emitting diode (OLED) display device. Certainly, embodiments of the present disclosure include but are not limited thereto, the array substrate can also be an array substrate of a liquid crystal display device, other components and structures thereof can refer to a usual design, which will not be repeated here.

An embodiment of the present disclosure provides a display device, which includes the array substrate described in any example of the abovementioned embodiments. Therefore, the display device has a beneficial effect corresponding to the beneficial effect of the array substrate included therewith. For example, the display device can effectively avoid short circuit, open circuit, and other defects by providing a protective structure on both sides of the metal wires, thereby having a high yield rate.

For example, the display device can be any electronic product having a display function such as a computer, a television, a notebook computer, a tablet computer, a navigator, or the like. In addition, the display device can also be a wearable smart device.

The following points should to be explained:

1) The drawings of at least one embodiment of the present disclosure only relate to the structure in the embodiment of the present disclosure, and other structures may be referenced to the usual design.

2) In the absence of conflict, the features of the same embodiment and the different embodiments can be combined with each other.

The above are only specific implementations of the present disclosure, however the scope of the present disclosure is not limited thereto, variations or substitutions that easily occur to any one skilled in the art within the technical scope disclosed in the present disclosure should be encompassed in the scope of the present disclosure. Therefore, the scope of the present disclosure should be based on the scope of the claims.

What is claimed is:

1. A manufacturing method of an array substrate, comprising:
   forming a source-drain metal pattern on a substrate, wherein the substrate comprises a display region and a peripheral region located around the display region, the source-drain metal pattern located on the peripheral region comprises a plurality of metal wires; and
   forming a protective structure on a lateral side of each of the metal wires, wherein the protective structure contacts and covers the lateral side of each of the metal wires,
   wherein forming the protective structure on the lateral side of each of the metal wires comprises:
   forming a protective layer covering the source-drain metal pattern on a side of the source-drain metal pattern away from the substrate; and
   patterning the protective layer by using a first mask plate to remove the protective layer on a side of the metal wires away from the substrate and leave the protective layer on the lateral side of the metal wires to form the protective structure.

2. The manufacturing method of the array substrate according to claim 1, wherein forming the source-drain metal pattern on the substrate comprises:
   forming a source-drain metal layer on the substrate;
   forming a first photoresist on a side of the source-drain metal layer away from the substrate;
   forming a first photoresist pattern by exposing and developing the first photoresist using a second mask plate; and
   forming the source-drain metal pattern by taking the first photoresist pattern as a mask to etch the source-drain metal layer.

3. The manufacturing method of the array substrate according to claim 2, wherein the protective layer comprises a second photoresist.

4. The manufacturing method of the array substrate according to claim 3, wherein the first photoresist is a positive photoresist, and the second photoresist is a negative photoresist.

5. The manufacturing method of the array substrate according to claim 3, wherein the first photoresist is a negative photoresist, the second photoresist is a positive photoresist, and the second mask plate and the first mask plate are a same mask plate.

6. The manufacturing method of the array substrate according to claim 1, further comprising:
   forming a first electrode layer on a side of the source-drain metal pattern and the protective structure away from the substrate; and
   patterning the first electrode layer to form a first electrode layer pattern and expose the metal wires and the protective structure.

7. The manufacturing method of the array substrate according to claim 6, wherein patterning the first electrode layer to form the first electrode layer pattern and expose the metal wires and the protective structure comprises a wet etching process.

8. The manufacturing method of the array substrate according to claim 1, wherein the source-drain metal pattern comprises a first metal layer and second metal layers located on both sides of the first metal layer.

9. An array substrate, comprising:
   a substrate; and
   a source-drain metal pattern, disposed on the substrate;
   wherein the substrate comprises a display region and a peripheral region around the display region, the source-drain metal pattern located on the peripheral region comprises a plurality of metal wires, a lateral side of each of the metal wires is provided with a protective structure, and the protective structure contacts and covers the lateral side of each of the metal wires, wherein a material of the protective structure comprises photoresist.

10. The array substrate according to claim 9, wherein the source-drain metal pattern comprises a first metal layer and second metal layers located on both sides of the first metal layer.

11. The array substrate according to claim 10, wherein the first metal layer comprises at least one selected from the group consisting of copper, aluminum, and silver.

12. The array substrate according to claim 10, wherein the second metal layers comprise titanium.

13. The array substrate according to claim 9, further comprising:
- an anode, located on a side of the source-drain metal pattern away from the substrate;
- an organic light emitting layer, located on a side of the anode away from the substrate; and
- a cathode, located on a side of the organic light emitting layer away from the substrate.

14. A display device, comprising the array substrate according to claim 9.

* * * * *